(12) United States Patent
Li et al.

(10) Patent No.: US 6,849,467 B1
(45) Date of Patent: Feb. 1, 2005

(54) MOCVD OF $TiO_2$ THIN FILM FOR USE AS FERAM $H_2$ PASSIVATION LAYER

(75) Inventors: Tingkai Li, Vancouver, WA (US); Wei Pan, Vancouver, WA (US); Robert A. Barrowcliff, Vancouver, WA (US); David R. Evans, Beaverton, OR (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/621,863

(22) Filed: Jul. 16, 2003

(51) Int. Cl.[7] .................. H01L 21/00; H01L 21/8242
(52) U.S. Cl. ..................... 438/3; 438/243; 438/244; 438/248; 438/253; 438/386; 438/387; 438/396
(58) Field of Search ................. 438/3, 243, 244, 438/248, 253, 386, 387, 396

(56) References Cited

U.S. PATENT DOCUMENTS 6,642,563 B2 * 11/2003 Kanaya ................. 257/296
6,645,807 B2 * 11/2003 Tsuzumitani et al. ....... 438/243

* cited by examiner

*Primary Examiner*—Hsien-Ming Lee
(74) *Attorney, Agent, or Firm*—David C. Ripma; Matthew D. Rabdau; Joseph P. Curtin

(57) ABSTRACT

A method of forming an $H_2$ passivation layer in an FeRAM includes preparing a silicon substrate; depositing a layer of $TiO_x$ thin film, where $0<x<2$, on a damascene structure; plasma space etching of the Ti or $TiO_x$ thin film to form a $TiO_x$ sidewall; annealing the $TiO_x$ side wall thin film form a $TiO_2$ thin film; depositing a layer of ferroelectric material; and metallizing the structure to form a FeRAM.

17 Claims, 4 Drawing Sheets

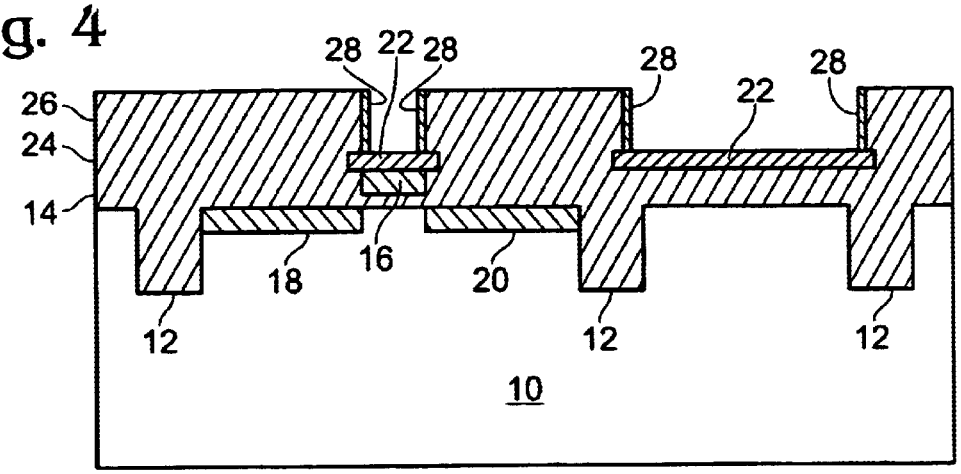
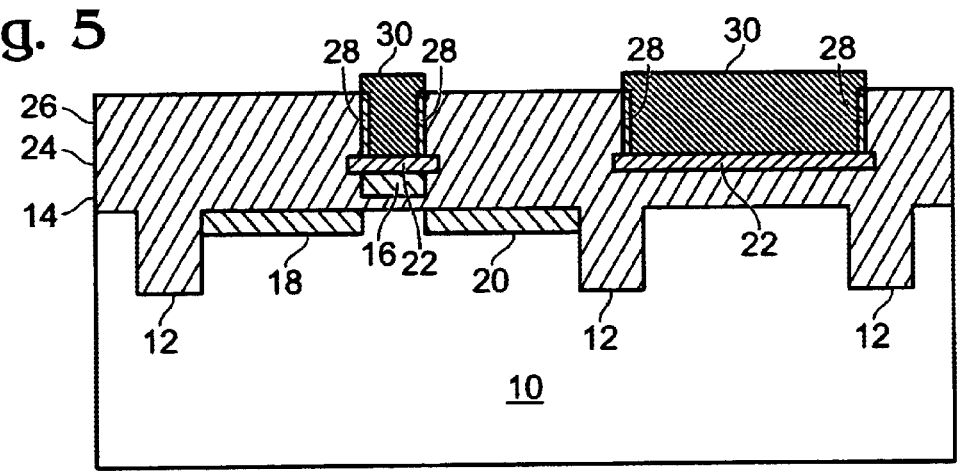
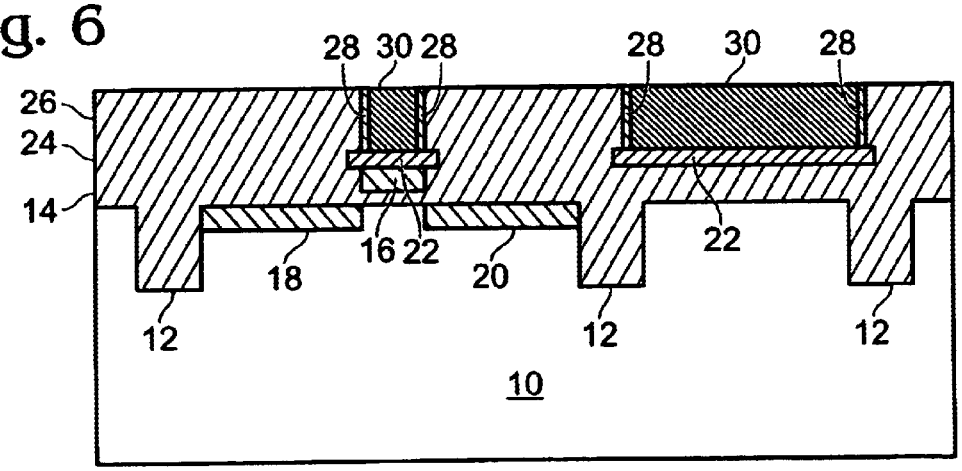

MOCVD OF TIO₂ THIN FILM FOR USE AS FERAM H₂ PASSIVATION LAYER

FIELD OF THE INVENTION

This invention relates to oxide thin film processes for $H_2$ passivation layers, ferroelectric memory device structures and integrated processes for ferroelectric non-volatile memory devices, and specifically, to a method of depositing a $TiO_2$ thin film which is used as an $H_2$ passivation layer.

BACKGROUND OF THE INVENTION

Metal, Ferroelectrics, Insulator, and Silicon (MFNIS) and Metal, Ferroelectrics, Insulator, and Silicon (MFIS) transistor ferroelectric memory devices have been proposed for use as FeRAM devices. In the integration processes of such devices, forming gas annealing generally is necessary to reduce trapped charges in high-k gate oxides and to improve the contact between metal connections and the source and the drain. However, forming gas annealing degrades the properties of ferroelectric thin films. Therefore, a $H_2$ passivation layer, covering the ferroelectric thin film, is an important structure in fabrication of IT ferroelectric memory devices.

SUMMARY OF THE INVENTION

A method of forming an $H_2$ passivation layer in an FeRAM includes preparing a silicon substrate; depositing a layer of $TiO_x$ thin film, where $0<x<2$, on a damascene structure; plasma space etching of the $TiO_x$ thin film to form a $TiO_x$ sidewall; annealing the $TiO_x$ side wall thin film to form a $TiO_2$ thin film; depositing a layer of ferroelectric material; and metallizing the structure to form a FeRAM.

It is an object of the invention to provide a $TiO_2$ thin film as a $H_2$ passivation layer for improving the properties of 1 T ferroelectric memory devices.

Another object of the invention is to provide a $TiO_x$ thin film having good step coverage on a damascene structure.

A further object of the invention is to use a plasma space etching process on a $TiO_x$ thin film to form a $TiO_2$ thin film as a $H_2$ passivation layer.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIGS. 1–8 depict steps in device formation according to the method of the invention.

DETAILED DESCRIPTION OF THE PREFERRED EMBODIMENTS

In the method of the invention, $TiO_x$ may be deposited in either of two embodiments to make $TiO_2$ as a $H_2$ passivation layer. In the first embodiment of the method of the invention, a CVD process is used to deposit Ti or $TiO_x$ thin films on a damascene structure, providing good step coverage, followed by plasma space etching of the $TiO_x$ thin film to form a $TiO_x$ sidewall, and annealing the $TiO_x$ side wall thin film to form a $TiO_2$ thin film. The second embodiment of the method of the invention includes a CVD process to deposit a $TiO_x$ or $TiO_2$ thin film on a damascene structure, again providing good step coverage, annealing the $TiO_x$ thin film to form a $TiO_2$ thin film, and plasma space etching the $TiO_2$ thin film to form a sidewall on the trench structure.

Figure 1:
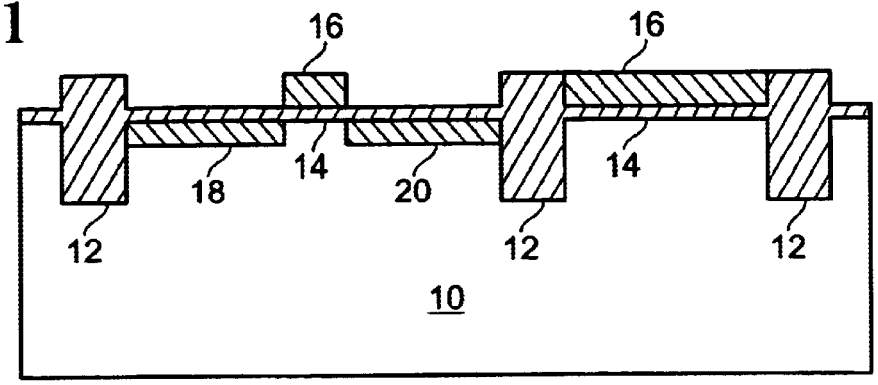

Referring initially to FIG. 1, a silicon wafer 10 is prepared for fabrication of IC devices, which preparation may include doping to form a P-type silicon wafer, including threshold adjustment ion implantation, for use as a substrate for a Lead Germanium Oxide ($Pb_5Ge_3O_{11}$) (PGO) MFMPOS one-transistor FeRAM device. FIG. 1 depicts the structure following wafer preparation, STI and filling of the trenches so formed with oxide 12, growth of a gate oxide 14 and deposition of a polysilicon layer 16, and, in this example, ion implantation to form an $N^+$ source 18 and an $N^+$ drain 20. The oxide is smoothed by CMP, photoresist is applied and the polysilicon layer etched.

Figure 2:
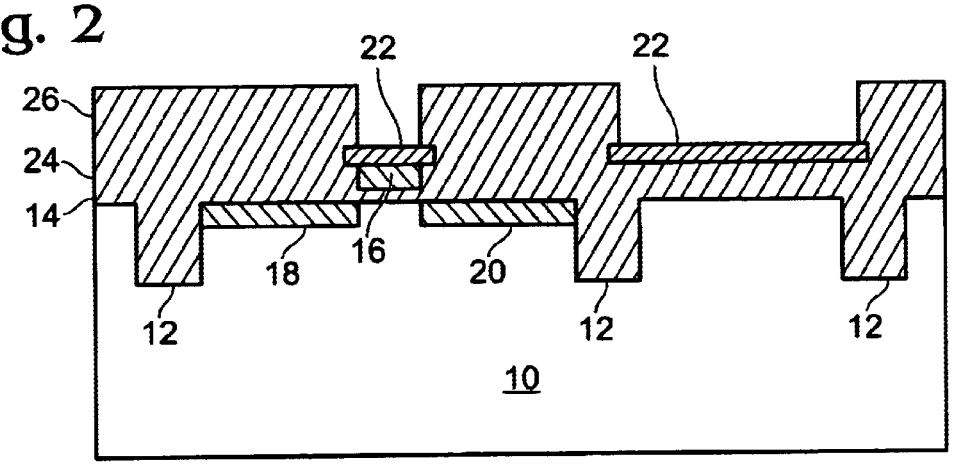

FIG. 2 depicts the structure following CVD of oxide, which is smoothed by CMP, stopping at the level of polysilicon layer 16. A larger size bottom electrode 22, which, in the preferred embodiment, is an Iridium electrode is deposited and patterned. Another layer of oxide 24 is deposited by CVD and smoothed by CMP, stopping at the level of the Iridium layer, tetraethylorthosilicate oxide (oxane or TEOS) 26 is deposited by CVD, patterned and etched to form trench structures.

Figure 3:
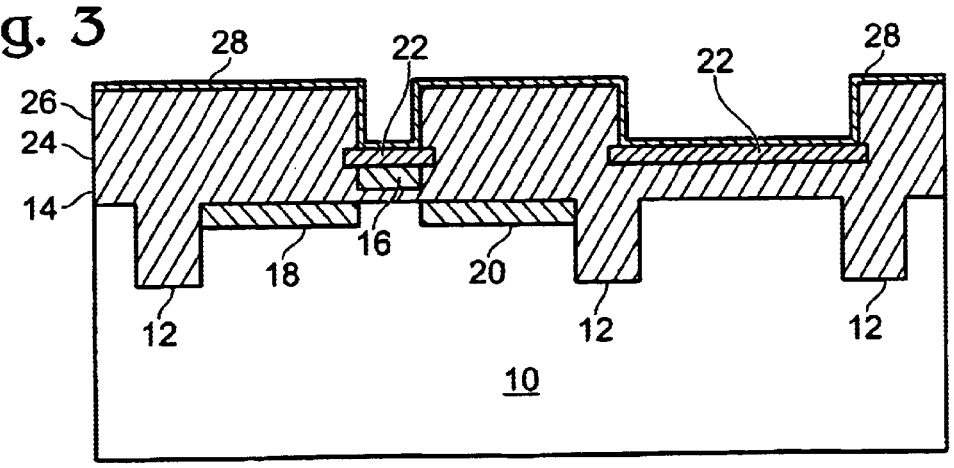

FIG. 3 depicts the structure following CVD of a $TiO_x$ layer 28, where $0<x<2$. As will be apparent to those of skill in the art, when $x=0$, the CVD is only of titanium. The MOCVD process includes preparing a MOCVD precursor, including dissolving 0.2 mol $Ti(OC_3H_7)_4$ in Octane, resulting in a precursor solution having a concentration of 0.2 mol $Ti(OC_3H_7)_4$. The precursor solution is injected into a vaporizer at temperature in the range of between about 80° C. to 120° C. by a liquid controller at a rate of between about 0.1 ml/min to 0.5 ml/min to form a precursor gases. The feed line is maintained at between about 80° C. to 120° C., the deposition temperature is between about 380° C. to 420° C., the deposition pressure is maintained at between about 0.5 torr to 5 torr, and the deposition time ranges from between about five minutes to thirty minutes, depending on the required $TiO_2$ thickness. $TiO_x$ layer 28 may be, in the first embodiment of the method of the invention, plasma space etched, them annealed in an oxygen atmosphere to form a $TiO_2$ tin film. The structure is HF dipped to clean the surface of Iridium bottom electrode 20, resulting in the structure depicted in FIG. 4. The plasma space etching process for $TiO_x$ thin film 22 includes setting TCP Rf power at about 370W and setting the bias power to about 130 W at a chamber pressure of about 5 torr. The etching chemicals used in the process include $BCl_3$ at a flow rate of about 30 sccm, and $Cl_2$ at a flow rte of about 58 sccm.

FIG. 5 depicts the structure following selective deposition of a ferroelectric thin film 30 by MOCVD. The upper surface of the FE and $TiO_x$ extend above the level of the lasty deposited oxide layer because PGO may be selectively deposited on iridium and $TiO_2$, but will not form on $SiO_2$, therefor, the PGO will only be deposited on those areas which have exposed iridium and $TiO_2$.

FIG. 6 depicts the structure following CMP of ferroelectric thin film 30, surrounding $TiO_x$ 28, and oxide 26.

Figure 7:
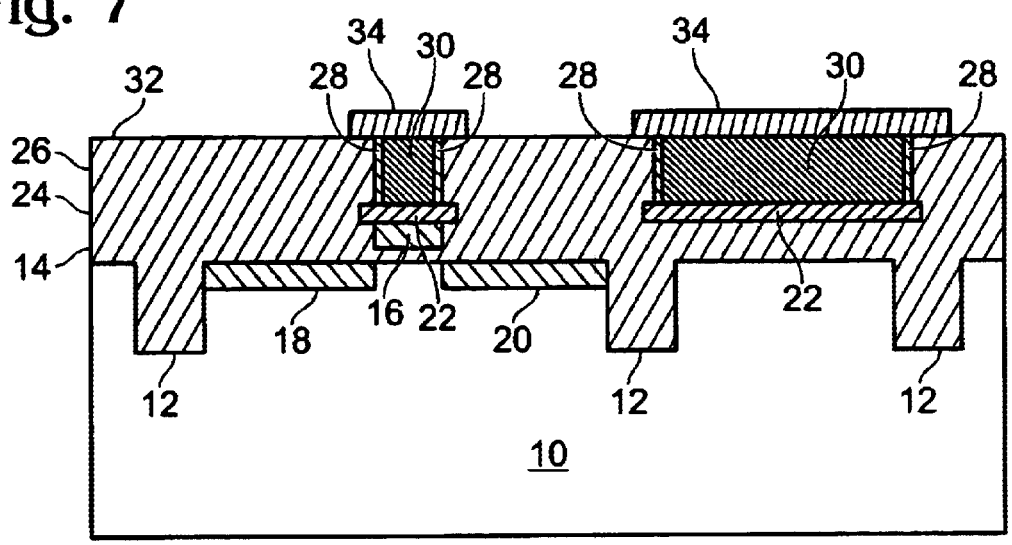

FIG. 7 depicts the structure following-deposition and annealing of a high-k oxide 32, deposition of a top electrode layer 34, and patterning and etching of the top electrode layer to form top electrodes 34.

Figure 8:
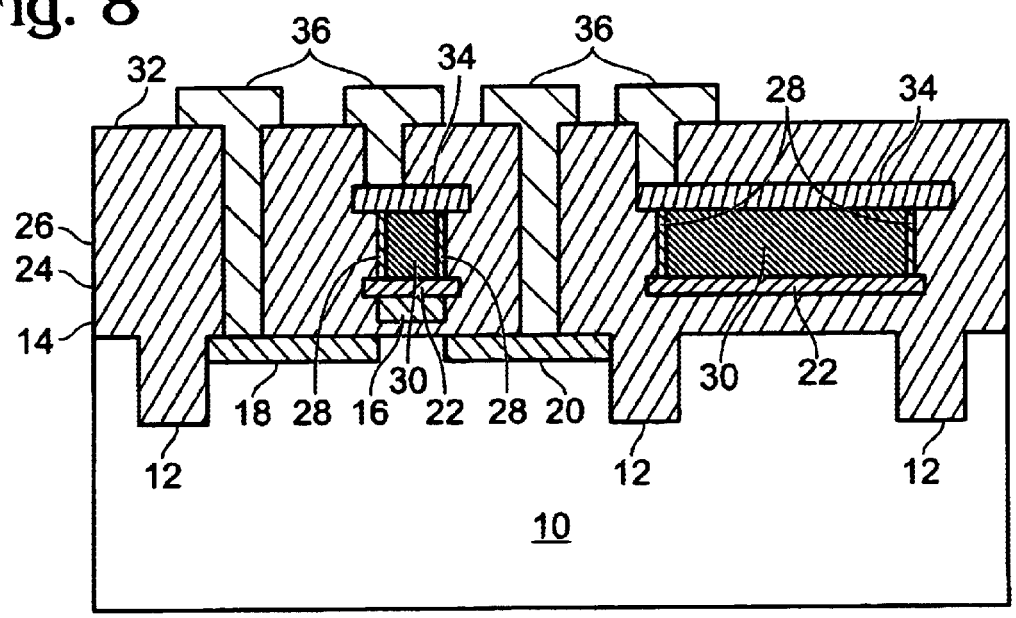

FIG. 8 depicts the FeRAM constructed according to the first embodiment of the method of the invention following etching of contact holes and metallization 36.

Figure 9:
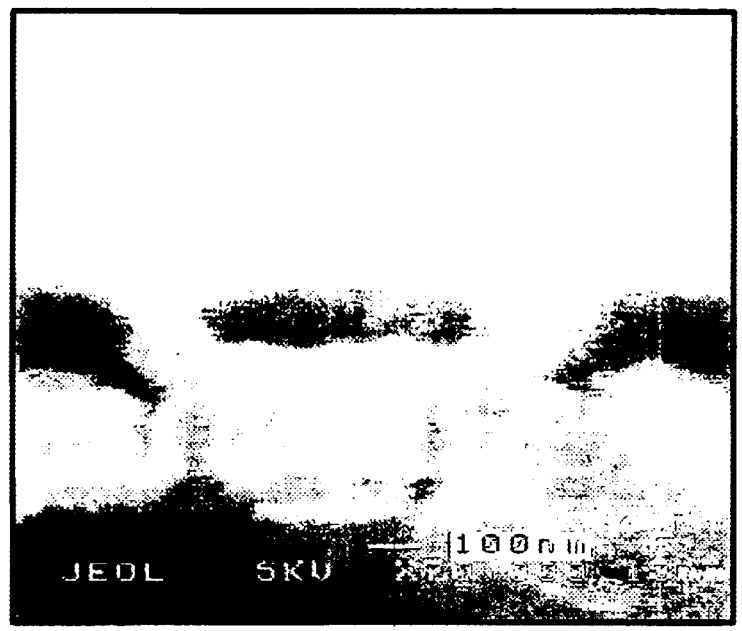
FIGS. 9 and 10 are microphotographs of the structure during device fabrication.

FIG. 9 depicts the structure following deposition of $TiO_x$ thin film layer 28, which illustrates deposition on oxide trench structures with very good step coverage.

Figure 10:
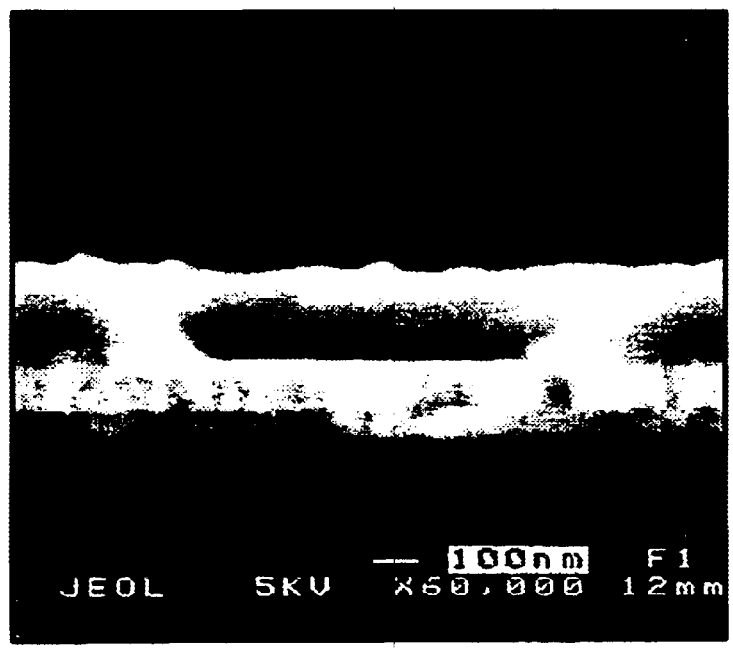

FIG. 10 depicts the structure after plasma space etching, and illustrates the $TiO_x$ side wall thin film formed on oxide trench structures.

In the second embodiment of the method of the invention, the same processes are followed, as described in connection with FIGS. 1–3. The annealing step, described in connection with FIG. 7, is next performed, converting $TiO_x$ to $TiO_2$, which is then followed by the steps described in connection with FIGS. 4–6 and 8.

Thus, a method for MOCVD $TiO_2$ thin film as FeRAM $H_2$ passivation layer has been disclosed. It will be appreciated that further variations and modifications thereof may be made within the scope of the invention as defined in the appended claims.

We claim:

1. A method of forming an $H_2$ passivation layer in an FeRAM, comprising:
   preparing a silicon substrate, including doping to form a P-type silicon wafer, including threshold adjustment ion implantation, shallow trench isolation, growth of a gate oxide, deposition of a polysilicon layer, ion implantation to form an $N^+$ source and an drain depositing a layer of oxide; smoothing the oxide by CMP, and patterning and etching the polysilicon layer;
   depositing a layer of $TiO_x$ thin film, where $0<x<2$, on a damascene structure;
   plasma splice etching of the $TiO_x$ thin film to form a $TiO_x$ sidewall;
   annealing the $TiO_x$ side wall thin film to form a $TiO_2$ thin film;
   depositing a layer of ferroelectric material; and
   metallizing to form a FeRAM.

2. The method of claim 1 wherein said plasma space etching precedes said annealing.

3. The method of claim 1 wherein said annealing precedes said plasma space etching.

4. The method of claim 1 which include after said preparing, depositing a layer of oxide; smoothing the oxide by CMP; stopping at the level of the polysilicon layer; depositing a bottom electrode; depositing another layer of oxide by CVD; and smoothing the another layer of oxide by CMP stopping said smoothing at the level of the bottom electrode, depositing yet another layer of oxide by CVD; and patterning and etching both of the oxide layers to form trench structures.

5. The method of claim 1 wherein said plasma space etching of the $TiO_x$ thin film includes setting TCP RF power at about 370W, setting the bias power to about 130 W at a chamber pressure of about 5 torr; and using etching including $BCl_3$ at a flow rate of about 30 sccm and $Cl_2$ at a flow rate of about 58 sccm.

6. The method of claim 1, wherein said depositing a layer of $TiO_x$ thin film, where $0<x<2$, includes preparing a MOCVD precursor, including dissolving about 0.2 mol $Ti(OC_3H_7)_4$ in Octane, resulting in a precursor solution having a concentration of 0.2 mol $Ti(OC_3H_7)_4$.

7. The method of claim 6, which further includes injecting the precursor solution into a CVD char vaporizer at temperature in the range of between about 80° C. to 120° C. by a liquid controller at a rate of between about 0.1 ml/min to 0.5 ml/min to form a precursor gases; maintaining a CVD chamber feed line at a temperature of between about 80° C. to 120° C.; maintaining the deposition temperature at between about 380° C. to 420° C.; maintaining the deposition pressure at between about 0.5 torr to 5 torr, and continuing the deposition process for between about five minutes to thirty minutes.

8. A method of forming an $H_2$ passivation layer in an FcRAM, comprising:
   preparing a silicon substrate;
   depositing a layer of $TiO_x$ thin film, where $0<x<2$, on a damascene structure;
   plasma space etching of the $TiO_x$ thin film to form a $TiO_x$ sidewall, including setting TCP Rf power at about 370W, setting the bias power to about 130 W at a chamber pressure of about 5 torr; and using etching including BCl, at a flow rate of about 30 sccm and C at a flow rate of about 58 sccm;
   annealing the $TiO_x$ side wall thin film to form a $TiO_2$ thin film;
   depositing a layer of ferroelectric material; and
   metallizing to form a FeRAM.

9. The method of claim 8, wherein said preparing a silicon substrate includes doping to form a P-type silicon wafer, including threshold adjustment ion implantation, shallow trench isolation, growth of a gate oxide, deposition of a polysilicon layer, ion implantation to form an $N^+$ source and an drain; smoothing the oxide by CMP, and patenting and etching the polysilicon layer.

10. The method of claim 9 which includes, after said preparing, depositing a layer of oxide; smoothing the oxide by CMP; stopping at the level of the polysilicon layer; depositing a bottom electrode; depositing another layer of oxide by CVD; a smoothing the another layer of oxide by CMP, stopping said smoothing at the level of the bottom electrode; depositing yet another layer of oxide by CVD, and patterning and etching the oxide layers to form trench structures.

11. The method of claim 8, wherein said depositing a layer of $TiO_x$ thin film, where $0<x<2$, includes preparing a MOCVD precursor, including dissolving about 0.2 mol $Ti(OC_3H_7)_4$ in Octane, resulting in a precursor solution having a concentration of 0.2 mol $Ti(OC_3H_7)_4$.

12. The method of claim 11, which further includes injecting the precursor solution into a CVD chamber vaporizer at temperature in the range of between about 80° C. to 120° C. by a liquid controller at a rate of between about 0.1 ml/min to 0.5 ml/min to form a precursor gases; maintaining a CVD chamber feed line at a temperature of between about 80° C. to 120° C.; maintaining the deposition temperature at between about 380° C. to 420° C.; maintaining the deposition pressure at between about 0.5 torr to 5 torr, and continuing the deposition process for between about five minutes to thirty minutes.

13. A method of forming an $H_2$ passivation layer in an FeRAM, comprising:
   preparing a silicon substrate;
   depositing a layer of $TiO_x$ thin film, where $0<x<2$, on a damascene structure including preparing a MOCVD precursor, including dissolving about 0.2 mol $Ti(OC_3H_7)$, in Octane, resulting in a precursor solution having a concentration of 0.2 mol $Ti(OC_3H_7)_4$;
   annealing the $TiO_x$ side wall thin film to form a $TiO_2$ thin film, plasma space etching of the $TiO_2$ thin film to form a $TiO_2$ sidewall;
   depositing a layer of ferroelectric material; and
   metallizing to form a FeRAM.

14. The method of claim 13, wherein said preparing a silicon substrate includes doping to form a P-type silicon wafer, including threshold adjustment ion implantation, shallow trench isolation, growth of a gate oxide, deposition of a polysilicon layer, ion implantation to form an N⁺ source and an drain; smoothing the oxide by CMP, and patterning and etching the polysilicon layer.

15. The method of clam 14, which includes, after said preparing, depositing a layer of oxide; smoothing the oxide by CMP; stopping at the level of the polysilicon layer; depositing a bottom electrode; depositing another layer of oxide by CVD; smoothing the other layer of oxide by CMP, stopping said smoothing at the level of the bottom electrode; depositing yet another layer of oxide by CVD; and patterning and etching both of the oxide layers to form trench structures.

16. The method of claim 13 wherein said plasma space etching of the TiO$_x$ thin film includes setting TCP RF power at about 370W, setting the bias power to about 130 W at a chamber pressure of about 5 torr, and using etching including BCl$_3$ at a flow rate of about 30 sccm and Cl$_2$ at a flow rate of about 58 sccm.

17. The method of claim 13, which fiber includes injecting the precursor solution into a CVD chamber vaporizer at temperature in the range of between about 80° C. to 120° C. by a liquid controller at a rate of between about 0.1 Kin to 0.5 ml/min to form a precursor gases; maintaining a CVD chamber feed line at a temperature of between about 80° C. to 120° C.; maintaining the deposition temperature at between about 380° C. to 420° C.; maintaining the deposition pressure at between about 0.5 torr to 5 torr, and continuing the deposition process for between about five minutes to thirty minutes.

* * * * *